(12) United States Patent
Agarwal et al.

(10) Patent No.: US 12,018,376 B2
(45) Date of Patent: Jun. 25, 2024

(54) APPARATUS AND METHODS FOR MOTOR SHAFT AND HEATER LEVELING

(71) Applicant: Applied Materials, Inc., Santa Clara, CA (US)

(72) Inventors: Ashutosh Agarwal, San Jose, CA (US); Tejas Ulavi, San Jose, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 846 days.

(21) Appl. No.: 17/024,946

(22) Filed: Sep. 18, 2020

(65) Prior Publication Data

US 2021/0087689 A1   Mar. 25, 2021

Related U.S. Application Data

(60) Provisional application No. 62/902,726, filed on Sep. 19, 2019.

(51) Int. Cl.
| | |
|---|---|
| *C23C 16/52* | (2006.01) |
| *C23C 16/458* | (2006.01) |
| *H01L 21/67* | (2006.01) |
| *H01L 21/687* | (2006.01) |

(52) U.S. Cl.
CPC .......... *C23C 16/52* (2013.01); *C23C 16/4583* (2013.01); *H01L 21/67103* (2013.01); *H01L 21/67248* (2013.01); *H01L 21/68764* (2013.01); *H01L 21/68771* (2013.01)

(58) Field of Classification Search
USPC ......... 118/712, 666, 667, 728–731, 725, 719
See application file for complete search history.

(56) References Cited

U.S. PATENT DOCUMENTS

| | | | |
|---|---|---|---|
| 3,783,822 A | 1/1974 | Wollam | |
| 7,637,114 B2 * | 12/2009 | Choi | F25B 41/24 |
| | | | 118/725 |
| 8,226,769 B2 * | 7/2012 | Matyushkin | H01L 21/67109 |
| | | | 156/345.52 |
| 8,585,823 B2 * | 11/2013 | Um | C30B 25/10 |
| | | | 118/728 |

(Continued)

FOREIGN PATENT DOCUMENTS

WO   2014163809 A1   10/2014

OTHER PUBLICATIONS

PCT International Search Report and Written Opinion in PCT/US2020/051517 dated Dec. 23, 2020, 11 pages.

*Primary Examiner* — Yewebdar T Tadesse
(74) *Attorney, Agent, or Firm* — Servilla Whitney LLC

(57) ABSTRACT

Process chambers and methods for leveling a motor shaft and substrate support plane are described. The process chamber includes a motor shaft connected to the process chamber with a plurality of motor bolts. A first plurality of sensors is arranged at about the same radial distance from the rotational axis and at different angular positions relative to the rotational axis and a second plurality of sensors are arranged to measure the support plane. An angle-dependent motor leveling profile is determined and shim values for the motor bolts are determined to level the motor shaft. The support plane is measured using the second plurality of sensors to level the support plane perpendicular to the motor shaft.

9 Claims, 16 Drawing Sheets

(56) References Cited

U.S. PATENT DOCUMENTS

| | | |
|---|---|---|
| 2003/0047132 A1 | 3/2003 | Boguslavskiy et al. |
| 2005/0126496 A1 | 6/2005 | Boguslavskiy et al. |
| 2009/0276097 A1 | 11/2009 | Patalay et al. |
| 2014/0263275 A1* | 9/2014 | Nguyen ................ G01K 13/08 |
| | | 374/179 |

* cited by examiner

APPARATUS AND METHODS FOR MOTOR SHAFT AND HEATER LEVELING

CROSS-REFERENCE TO RELATED APPLICATIONS

This application claims priority to U.S. Provisional Application No. 62/902,726, filed Sep. 19, 2019, the entire disclosure of which is hereby incorporated by reference herein.

TECHNICAL FIELD

Embodiments of the present disclosure pertain to the field of semiconductor manufacturing. In particular, embodiments of the disclosure are directed to apparatus and methods for leveling motor support shafts and substrate support surfaces.

BACKGROUND

In some chamber designs for atomic layer deposition (ALD) or chemical vapor deposition (CVD) processing, precursors and gases are delivered to a large substrate support or multiple substrate support surfaces through multiple gas distribution plates at the same time. The gas distribution plates are spaced from the substrate surfaces, or vice versa, forming one or more operational gaps. Such chambers can be highly sensitive to the consistency and uniformity of the gaps between different process stations and over time as the chamber is used. With gaps of about one millimeter for some multi-station deposition systems, the processes performed in the separate stations can be highly susceptible to small gap deviations.

The substrates supports for some processing chambers use a motor assembly with a shaft and at least one support surface. The shaft extends through a bottom of the processing chamber and maintains the support surfaces. Runout from the motor can cause precession; a change in the orientation of the rotational axis of the rotating shaft. This change in rotational axis orientation can result in rotating gap discrepancies.

Therefore, there is a need in the art for apparatus and methods for controlling the gap between the substrate support(s) and gas distribution assembly(s).

SUMMARY

One or more embodiments of the disclosure are directed to a processing chamber comprising a chamber body, a motor shaft, a substrate support a first plurality of sensors and a second plurality of sensors. The chamber body has a bottom and sidewalls defining an interior volume. The motor shaft extends through the bottom of the chamber body defining a rotational axis. The motor shaft is connected to a motor assembly connected to the bottom of the chamber body outside the interior volume, the motor assembly comprising a plurality of motor bolts. The substrate support has a support plane connected to the motor shaft within the interior volume. The first plurality of sensors are arranged at about the same radial distance from the rotational axis and at different angular positions relative to the rotational axis and the second plurality of sensors arranged to measure the support plane.

Additional embodiments of the disclosure are directed to a method for leveling a substrate support comprising a leveling a motor shaft connected to a substrate support configured to support and rotate a plurality of substrates around a rotational axis to remove runout of the motor shaft relative to the rotational axis to provide a leveled motor shaft, and leveling a support plane formed by the substrate support on the leveled motor shaft.

Additional embodiments of the disclosure are directed to a non-transitory computer readable medium including instructions, that, when executed by a controller of a processing chamber, cause the processing chamber to perform operations of obtaining an angle dependent motor leveling profile from at least three of a first plurality of sensors positioned at about the same radial distance from a rotational axis of a motor shaft and at different angular positions relative to the rotational axis, determining shim values for motor bolts based on the angle dependent motor leveling profiles of the at least three sensors; and determining a heater support plane for each of a plurality of heater supports connected to the motor shaft by measuring each heater support using at least three sensors from a second plurality of sensors.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Figure 1:
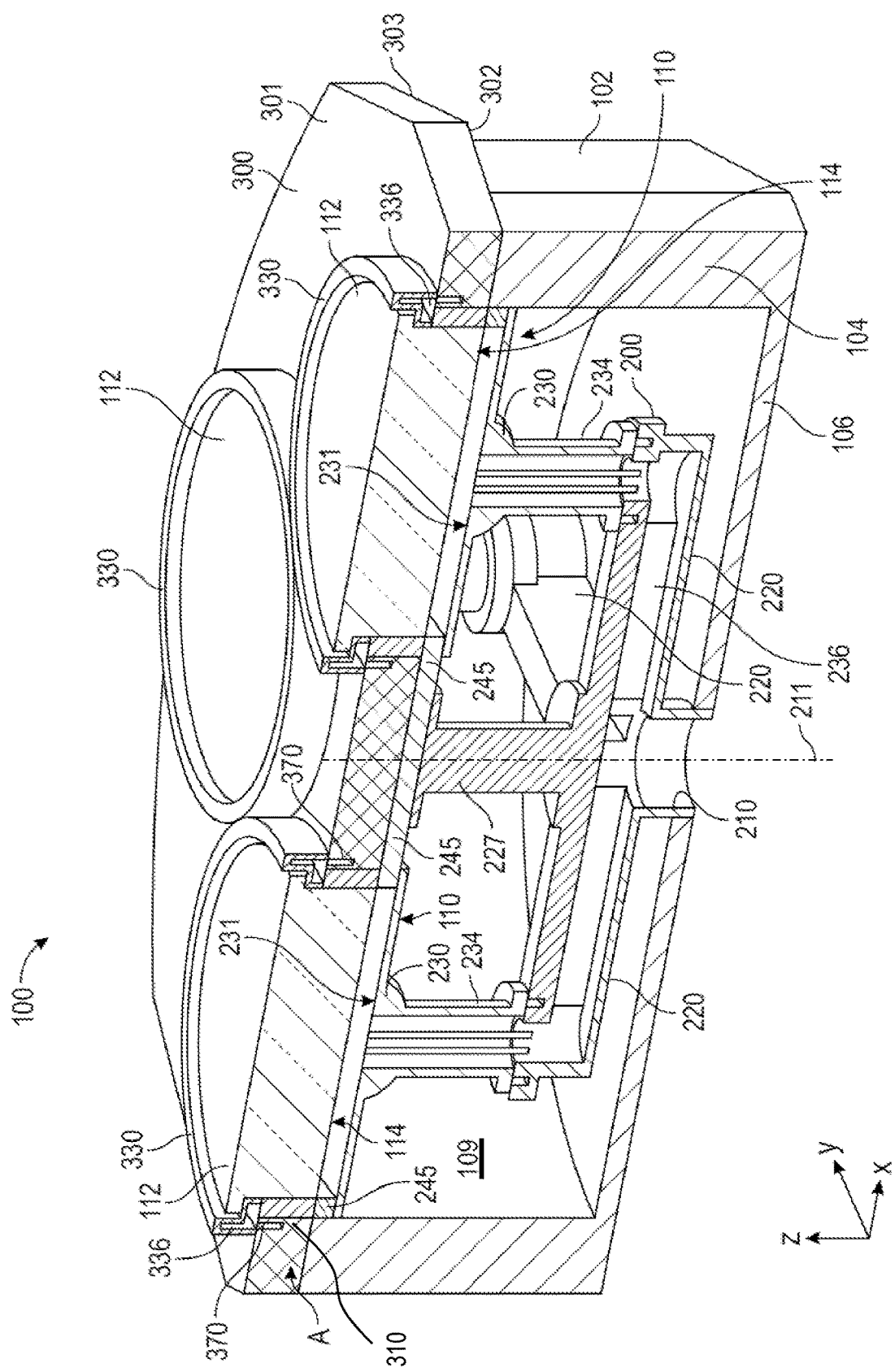
FIG. 1 shows a cross-sectional isometric view of a processing chamber in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure are directed to processing chambers having multiple (e.g., four) spatially separated processing environments, also referred to as processing stations. Some embodiments have more than four and some embodiments have less than four. The processing environments can be mounted with sealing surfaces that are coplanar and parallel to the substrate(s). The process environments are placed in a circular arrangement. A rotatable structure with one to four (or more) individual substrate heaters mounted thereon moves the substrates in a circular path with a diameter sufficient to align heaters with the process environments. Each heater may be temperature controlled and may have one or multiple concentric temperature control zones.

For substrate loading, the rotatable structure could be lowered so that a vacuum robot could pick-up finished substrates and place unprocessed substrates on lift pins located above each substrate heater (in the lower Z position).

In operation, in some embodiments, each substrate is under an independent environment until the process is finished. Once finished, the rotatable structure of some embodiments rotates to move the substrates on the heaters to the next process station environment (e.g., 90° rotation for four stations, 120° rotation if three stations) for processing.

In some embodiments, maintaining a small gap between the showerhead and the substrate can be used to increase dose gas utilization and cycle time speed. One or more embodiments provide precise showerhead temperature control and high operating temperature range (e.g., up to 230° C.). Without being bound by theory, it is believed that the closer the showerhead temperature is to the substrate temperature, the better the substrate temperature uniformity.

Some embodiments are directed to integrated processing platforms using a plurality of spatially separated processing stations (chambers) on a single tool. The processing platform can have a variety of chambers that can perform different processes.

Some embodiments of the disclosure are directed to apparatus and methods to move substrate(s) attached to a substrate heater(s) from one environment to another environment. The rapid movement can be enabled by electrostatically chucking (or clamping) the substrate(s) to the heater(s). The movement of the substrates can be in linear or circular motion.

In some embodiments, substrates go through a plurality of chambers for processing where at least one of the chambers performs sequential processing with a plurality of spatially separated environments within the same chamber.

Figure 2:
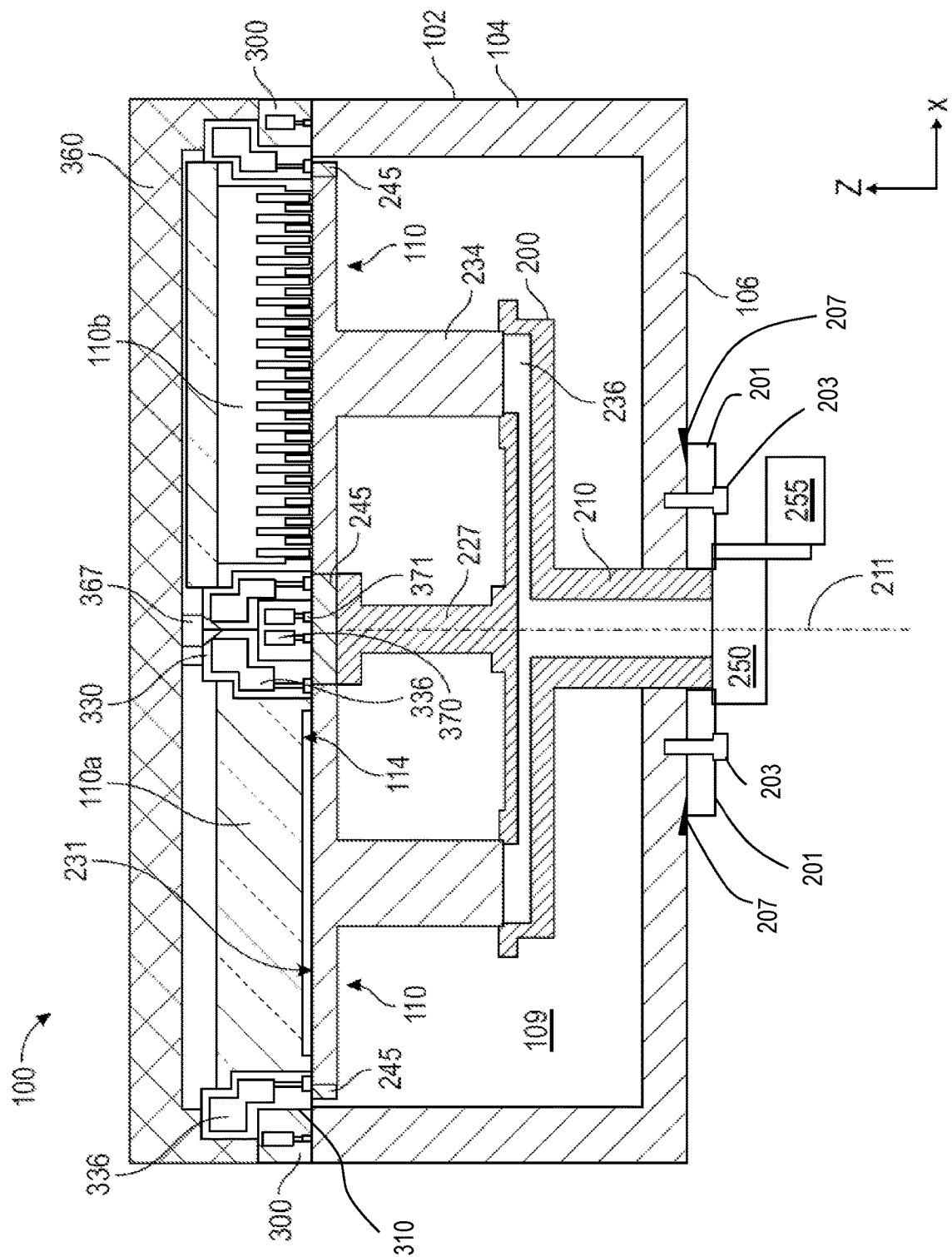
FIG. 2 shows a cross-sectional view of a processing chamber in accordance with one or more embodiment of the disclosure.
Figure 3:
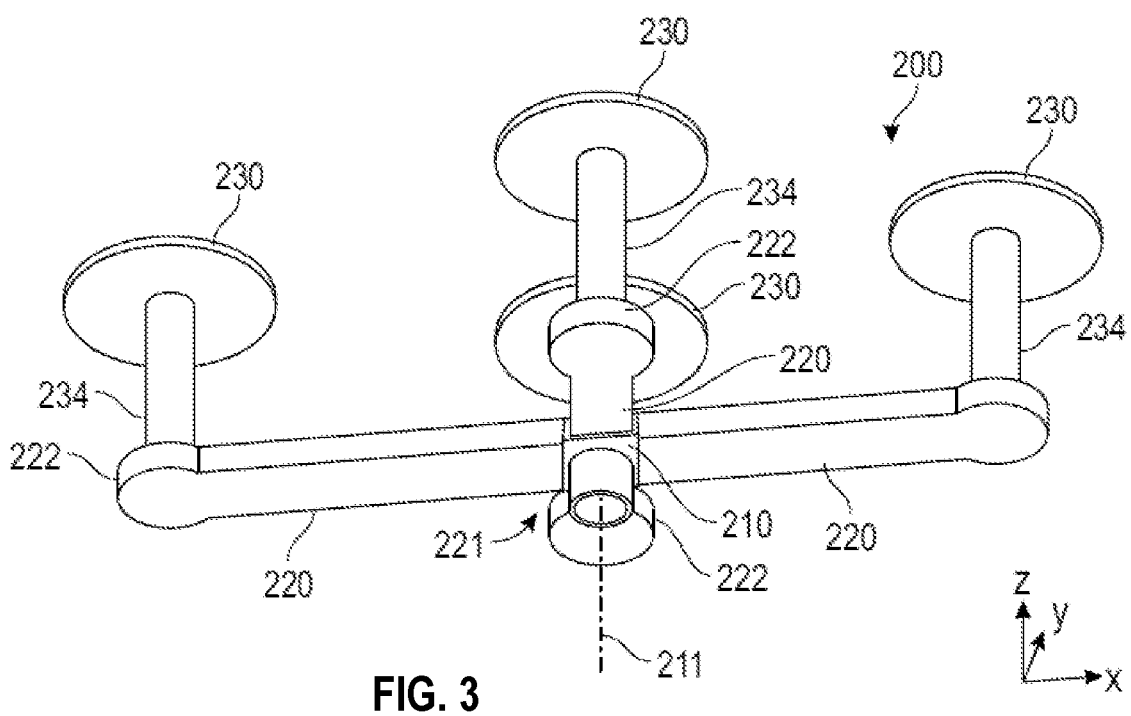
FIG. 3 shows a bottom perspective view of a support assembly in accordance with one or more embodiment of the disclosure.

Some embodiments include a structure built above the chamber with a vertical structural member applying a force upward to the center of the chamber lid to eliminate deflection caused by the pressure of atmosphere on the topside and the vacuum on the other side. The magnitude of force of the structure above can be mechanically adjusted based on the deflection of the top plate. The force adjustment can be done automatically using a feedback circuit and force transducer or manually using, for example, a leveling actuator can be automatically actuated or manually turned by an operator. With reference to FIG. 2, some embodiments of the top plate 300 include a bar 360 that passes over a center portion of the top plate 300. The bar 360 can be connected to the top plate 300 near the center using connector 367. The connector 367 can be used to apply force orthogonal to the top 331 or bottom 333 of the top plate 300 to compensate for bowing in the top plate 300 as a result of pressure differentials or due to the weight of the top plate 300. In some embodiments, the bar 360 and connector 367 are capable of compensating for deflection of up to or equal to about 1.5 mm at the center of a top plate having a width of about 1.5 m and a thickness of up to or equal to about 100 mm. In some embodiments, a motor 365 or actuator is connected to connector 367 and can cause a change in directional force applied to the top plate 300. The motor 365 or actuator can be supported on the bar 360. The bar 360 illustrated is in contact with the edges of the top plate 300 at two locations. However, the skilled artisan will recognize that there can be one connection location or more than two connection locations.

One or more embodiments of the disclosure advantageously provide methods for minimizing the total run out of a rotating assembly. Some embodiments advantageously provide methods and apparatus to measure and level components of a processing chamber. Some embodiments advantageously provide apparatus and methods to allow a multi-station process chamber to have a uniform gap between substrate support and gas distribution plates.

Some embodiments advantageously provide apparatus and methods that calculate the tilt individually between motor, heater (substrate support) and showerhead (gas distribution plate). The components can then be shimmed to level the relevant surfaces to minimize gap deviation. Some embodiments allow for achievement of a repeatable minimum separation gap of about 1.5 mm and a process gap of about 2 mm.

Some embodiments advantageously provide apparatus and methods that ensure parallelism between the heaters (substrate supports) and showerheads (gas distribution plates), wherein the planes formed by said components are within 0.1 mm of each other averaged across the chamber diameter.

FIGS. 1 and 2 illustrate a processing chamber 100 in accordance with one or more embodiment of the disclosure. FIG. 1 shows the processing chamber 100 illustrated as a cross-sectional isometric view in accordance with one or more embodiments of the disclosure. FIG. 2 shows a processing chamber 100 in cross-section according to one or more embodiments of the disclosure. Accordingly, some embodiments of the disclosure are directed to processing chambers 100 that incorporate a support assembly 200 and top plate 300.

Some embodiments of the disclosure are directed to top plates 300 for multi-station processing chambers. Referring to FIG. 1, the top plate 300 has a top surface 301 and a bottom surface 302 defining a thickness of the lid, and one or more edges 303. The top plate 300 includes at least one opening 310 extending through the thickness thereof. The openings 310 are sized to permit the addition of a gas injector 112 which can form a process station 110.

The processing chamber 100 has a housing 102 with walls 104 and a bottom 106. The housing 102 along with the top plate 300 define an interior volume 109, also referred to as a processing volume.

The process stations 110 are defined as a region in which processing can occur. For example, a process station 110 can be defined by the support surface 231 of the heaters 230, and the front face 114 of the gas injectors. The processing chamber 100 includes a plurality of process stations 110. The process stations 110 are located in the interior volume 109 of the housing 102 and are positioned in a circular arrangement around the rotational axis 211 of the support assembly 200. The process stations 110 are spatially arranged around the interior volume 109 of the processing chamber 100. Each process station 110 comprises a gas injector 112 having a front face 114.

The process stations 110 can be configured to perform any suitable process and provide any suitable process conditions. The type of gas injector 112 used will depend on, for example, the type of process being performed. For example, a process station 110 configured to operate as a thermal atomic layer deposition apparatus may have a showerhead or vortex type gas injector. Whereas, a process station 110 configured to operate as a plasma station may have one or more electrode and/or grounded plate configuration to generate a plasma while allowing a plasma gas to flow toward the substrate. The embodiment illustrated in FIG. 2 has a different type of process station 110 on the left side (process station 110a) of the drawing than on the right side (process station 110b) of the drawing. Suitable process stations 110 include, but are not limited to, thermal processing stations, microwave plasma, three-electrode CCP, ICP, parallel plate CCP, UV exposure, laser processing, pumping chambers, annealing stations and metrology stations.

Figure 6:
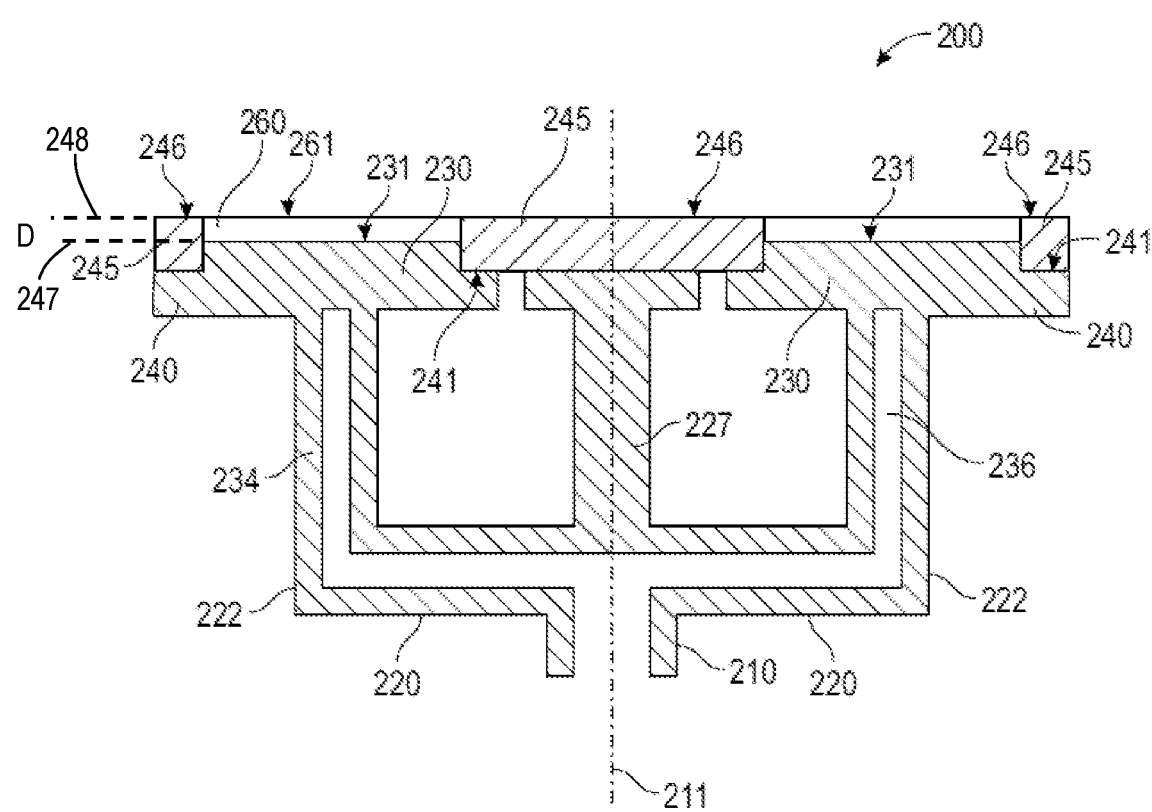
FIG. 6 shows a cross-sectional side view of a support assembly in accordance with one or more embodiment of the disclosure.

FIGS. 3 through 6 illustrate support assemblies 200 in accordance with one or more embodiments of the disclosure. The support assembly 200 includes a rotatable center base 210. The rotatable center base 210 can have a symmetrical or asymmetrical shape and defines a rotational axis 211. The rotational axis 211, as can be seen in FIG. 6, extends in a first direction. The first direction may be referred to as the vertical direction or along the z-axis; however, it will be understood that the use of the term "vertical" in this manner is not limited to a direction normal to the pull of gravity.

The support assembly 200 includes at least two support arms 220 connected to and extending from the center base 210. The support arms 220 have an inner end 221 and an outer end 222. The inner end 221 is in contact with the center base 210 so that when the center base 210 rotates around the rotational axis 211, the support arms 220 rotate as well. The support arms 220 can be connected to the center base 210 at the inner end 221 by fasteners (e.g., bolts) or by being integrally formed with the center base 210.

In some embodiments, the support arms 220 extend orthogonal to the rotational axis 211 so that one of the inner ends 221 or outer ends 222 are further from the rotational axis 211 than the other of the inner ends 221 and outer ends 222 on the same support arm 220. In some embodiments, the inner end 221 of the support arm 220 is closer to the rotational axis 211 than the outer end 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotation axis 211. In some embodiments, the support assembly 200 has n-number of support arms 220 and the n-number of support arms 220 are arranged to provide n-fold symmetry around the rotation axis 211.

A heater 230 is positioned at the outer end 222 of the support arms 220. In some embodiments, each support arm 220 has a heater 230. The center of the heaters 230 are located at a distance from the rotational axis 211 so that upon rotation of the center base 210 the heaters 230 move in a circular path.

The heaters 230 have a support surface 231 which can support a substrate. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the outer end 222 of the support arms 220. In some embodiments, as illustrated in the drawings, the heaters 230 are elevated above the outer end 222 of the support arms 220 by a heater standoff 234. The heater standoffs 234 can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body.

Figure 4:
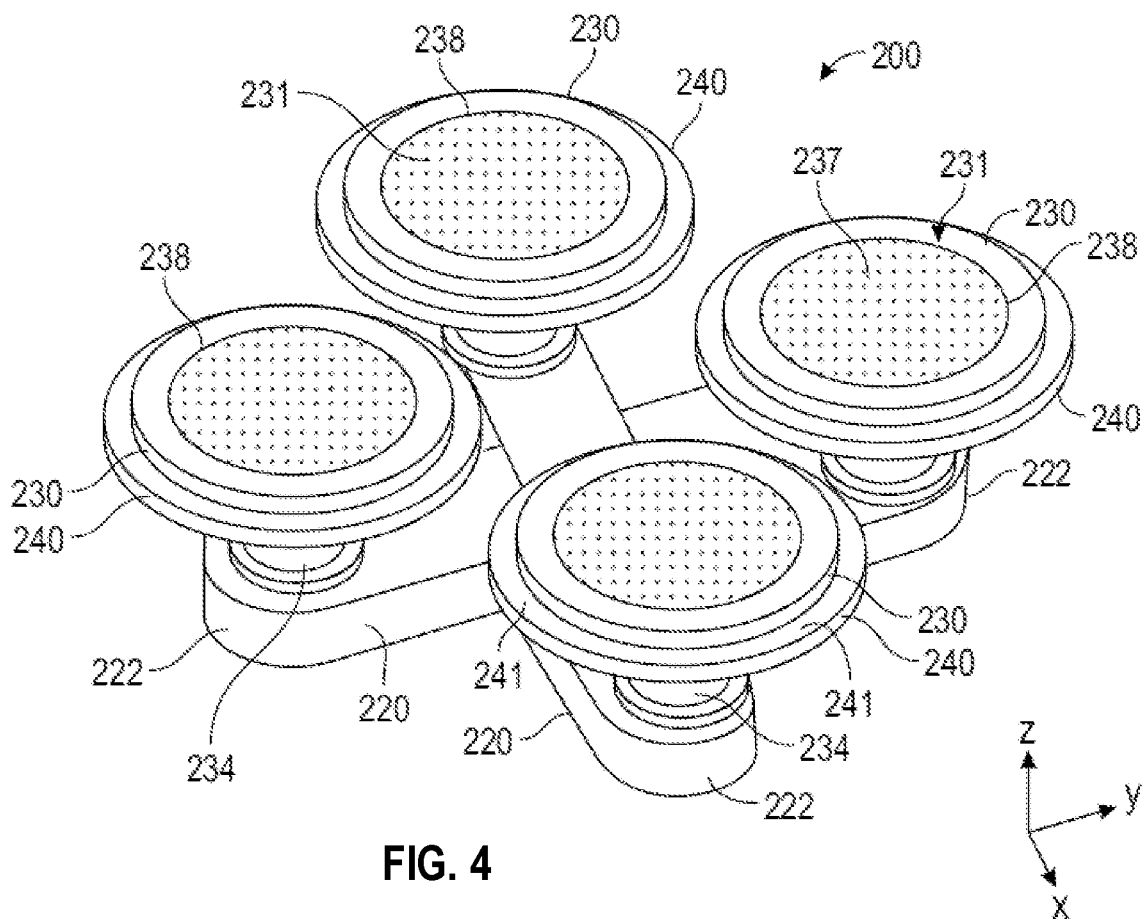
FIG. 4 shows a top perspective view of a support assembly in accordance with one or more embodiment of the disclosure.
Figure 5:
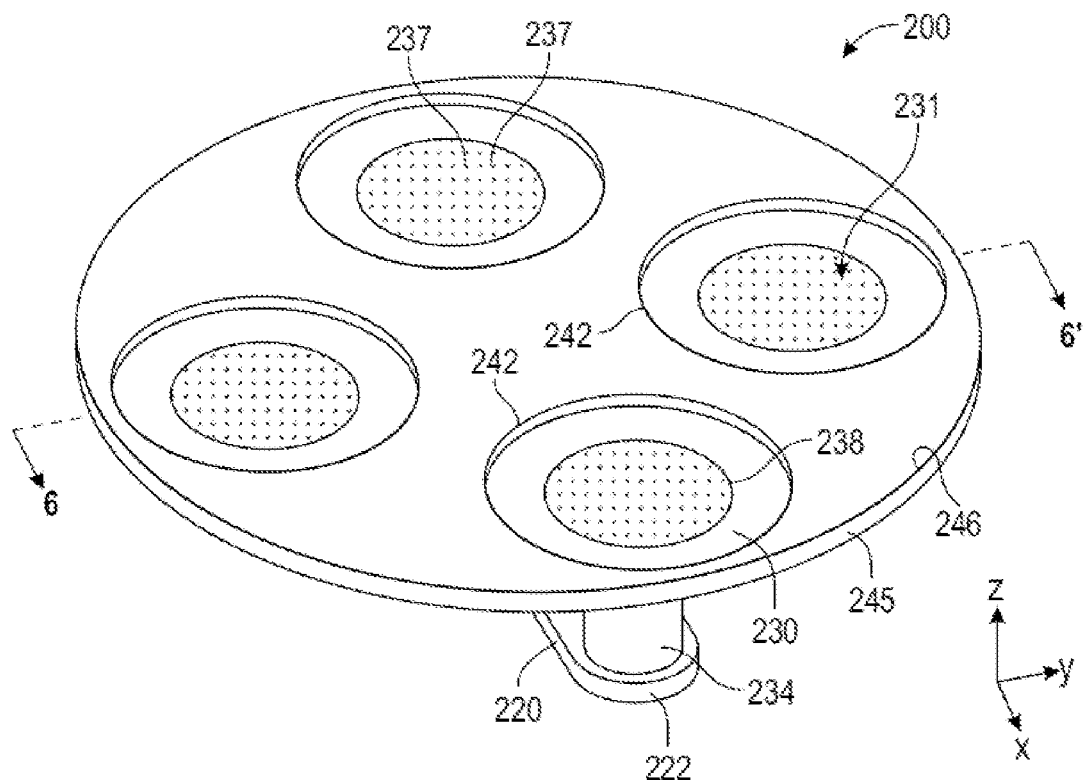
FIG. 5 shows a top perspective view of a support assembly in accordance with one or more embodiment of the disclosure.

In some embodiments, as shown in FIG. 4, the sealing platforms 240 are ring shaped and are positioned around each heater 230. In the illustrated embodiment, the sealing platforms 240 are located below the heater 230 so that the top surface 241 of the sealing platform 240 is below the support surface 231 of the heater.

The heaters 230 of some embodiments include additional components. For example, the heaters may comprise an electrostatic chuck. The electrostatic chuck can include various wires and electrodes so that a substrate positioned on the heater support surface 231 can be held in place while the heater is moved. This allows a substrate to be chucked onto a heater at the beginning of a process and remain in that same position on that same heater while moving to different process regions. In some embodiments, the wires and electrodes are routed through the channels 236 in the support arms 220.

Figure 7:
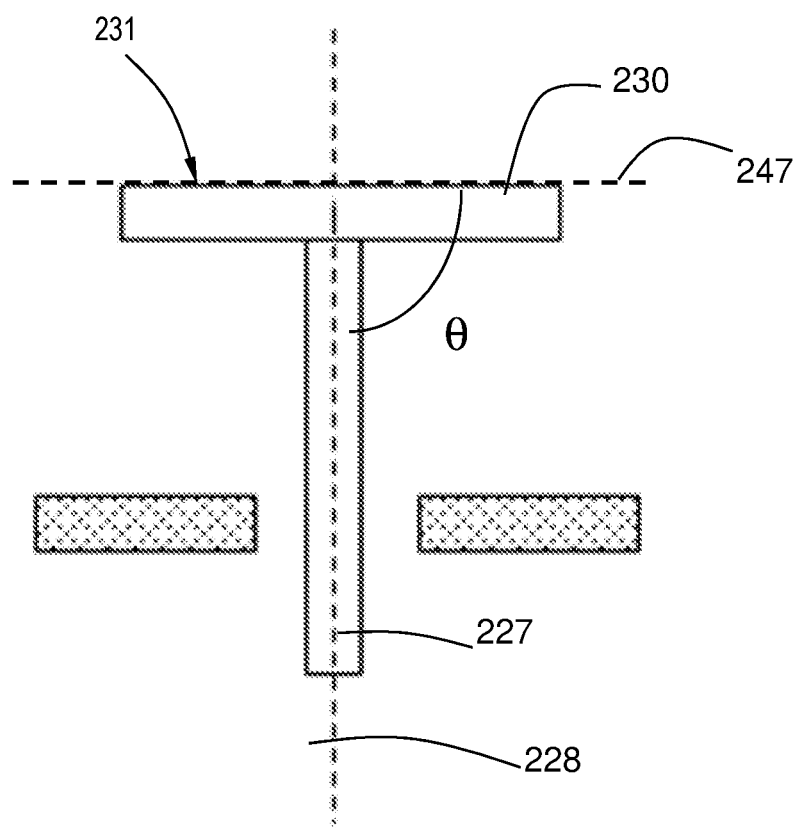
FIG. 7 shows a cross-sectional view of a heater assembly in accordance with one or more embodiment of the disclosure.

In some embodiments, as shown in FIG. 7, the support plate 245 and heaters 230 are supported by support shaft 227. The support shaft 227 may have utility in preventing sagging of the center of the support plate 245 when a single component platform is used. In some embodiments, there are no sealing platforms 240 and the support shaft 227 is the primary support for the support plate 245 and heaters 230. In some embodiments, the support plate 245 and heaters 230 are adjustably hinged on the support shafts 227 to allow for leveling.

In some embodiments, the support plate 245 has a top surface 246 forming a major plane 248 that is substantially parallel with a major support plane 247 formed by the support surface 231 of the heater 230. In some embodiments, the support plate 245 has a top surface 246 forming a major plane 248 that is a separation gap distance D above the major support plane 247 of the support surface 231. In some embodiments, the separation gap D is substantially equal to the thickness of a substrate 260 to be processed so that the substrate 260 surface 261 is coplanar with the top surface 246 of the support plate 245, as shown in FIG. 6. As used in this manner, the term "substantially coplanar" means that the major plane formed by the surface 261 of the substrate 260 is within ±1 mm, ±0.5 mm, ±0.4 mm, ±0.3 mm, ±0.2 mm or ±0.1 mm of coplanarity.

Some embodiments of the disclosure have separate components making up the support surfaces for processing. In some embodiments, the sealing platform 240 is a separate component than the heater 230 and is positioned so that the top surface 241 of the sealing platform 240 is below the support surface 231 of the heater 230. The distance between the top surface 241 of the sealing platform 240 and the support surface 231 of the heater 230 is sufficient to allow support plate 245 to be positioned on the sealing platforms 240. The thickness of the support plate 245 and/or position of the sealing platform 240 can be controlled so that the separation gap D between the top surface 246 of the support plate 245 is sufficient so that the top surface 261 of a substrate 260 is substantially coplanar with the top surface 246 of the support plate 245.

Figure 8:
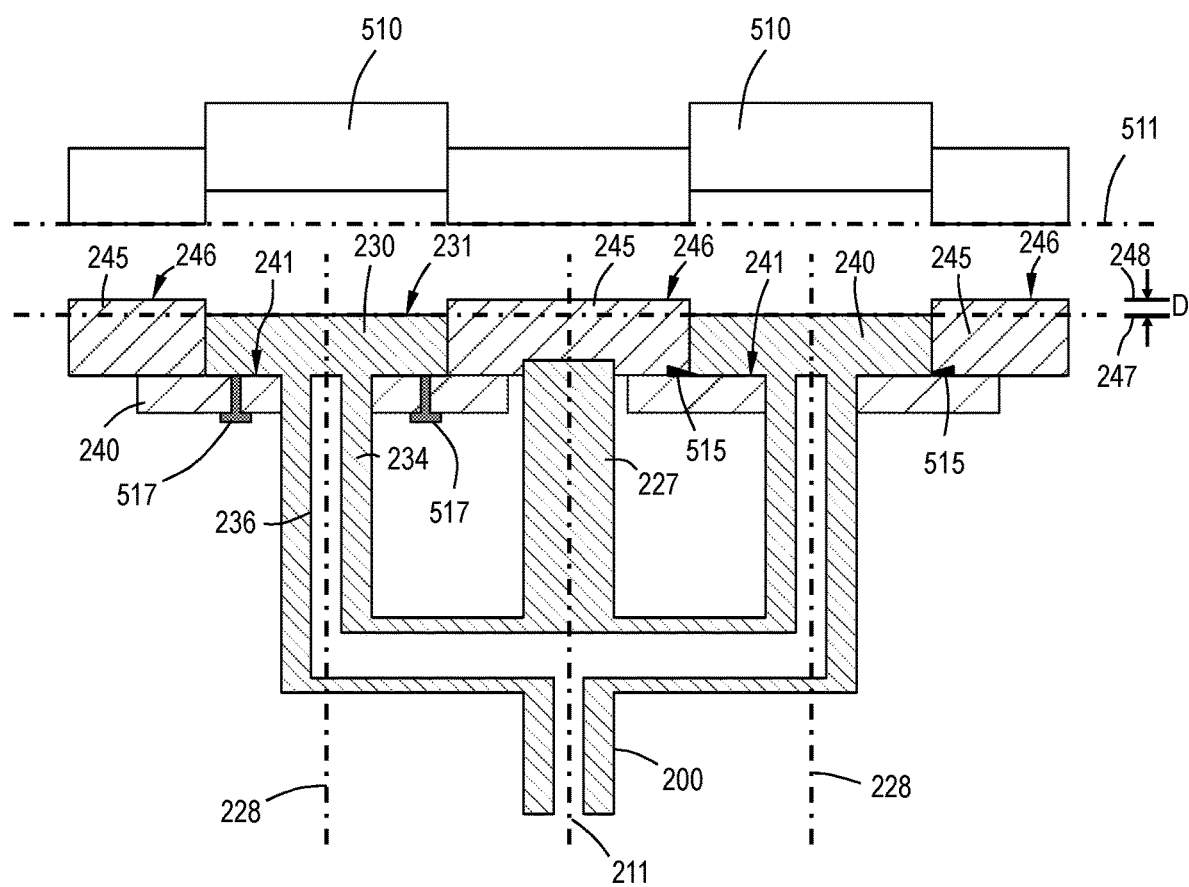
FIG. 8 shows a cross-sectional side view of a support assembly over a top plate in accordance with one or more embodiment of the disclosure.

As shown in FIGS. 7 and 8, the major support plane 274 of each of the support surfaces 231 of the heaters 230 are substantially coplanar to each of the other support surfaces 231 of heaters 230. In some embodiments, where the major support plane 274 is in the x-y plane, the major support plane 247 is at an angle θ with respect to a central axis 228 of the support shaft 227, the central axis 228 extending along a z-axis relative to the x-y plane of the major support plane 247. Ideally, the angle θ of the central axis 228 of the support shaft 227 relative to the major support plane 247 is at 90 degrees, thereby providing a horizontally level surface for the support surfaces 231.

As shown in FIGS. 7 and 8, target alignment is defined by support surfaces 231 being coplanar to one another, processing stations 510 being coplanar to one another, and major support plane 247 being parallel to a processing station plane 511, the processing station plane 511 being defined by coplanar processing stations 510. In some embodiments, target alignment is further defined by the major support plane 247 being at a right angle to the rotational axis 211 of the support assembly 200. In one or more embodiments, the separation gap D is uniformly 0.2 mm. As described in further detail below, the heaters 230 may be shimmed until the distance D of 0.2 mm is achieved. In some embodiments, the parallelism of processing stations 510 are also corrected using shims 515 or bolts 517.

Figure 9A:
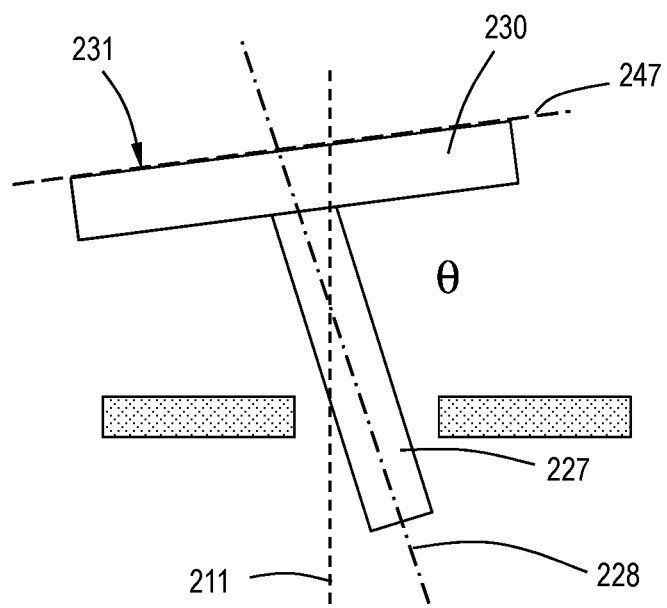
FIG. 9A shows a cross-sectional view of a heater assembly in accordance with one or more embodiment of the disclosure.

As shown in FIG. 9A, motor runout can cause the support surfaces 231 and support shafts 227 to be out of alignment, wherein the angle θ is no longer substantially 90 degrees, or central axis 228 of the support shaft 227 is no longer parallel to the rotational axis 211 of the support assembly 200. Continuous cycles and torsional forces can also contribute to improper alignment. As the shafts 227 and support assembly 200 rotate around their respective axes, improper alignment can induce wobble, processing volume variations within the processing chambers, or variation in the separation gap distance D.

In some embodiments, a calibration bar 600 (see FIG. 10) is utilized to mechanically correct improper alignment, such that support surfaces 231 are aligned with the major support plane 247. In some embodiments, mechanical correction includes, but is not limited to, shimming a connection point or flange between the shaft 227 and support assembly 200, shimming a connection point between the shaft 227 and the support arms 220, or adjusting bolts of the center base 210 described in further detail below.

In some embodiments, the calibration bar 600 can also be utilized to mechanically correct improper alignment of processing stations 510 positioned on the 1' [??] top plate 300. In some embodiments, mechanical correction includes, but is not limited to; shimming a connection point between the top plate 300 and the processing station 510. To utilize the calibration bar 600 to correct alignment of processing stations 510, the calibration bar 600 can be disposed on the bottom surface of the top plate 300, utilizing the features and methods as described with respect to the support surfaces 231 below.

Figure 9B:
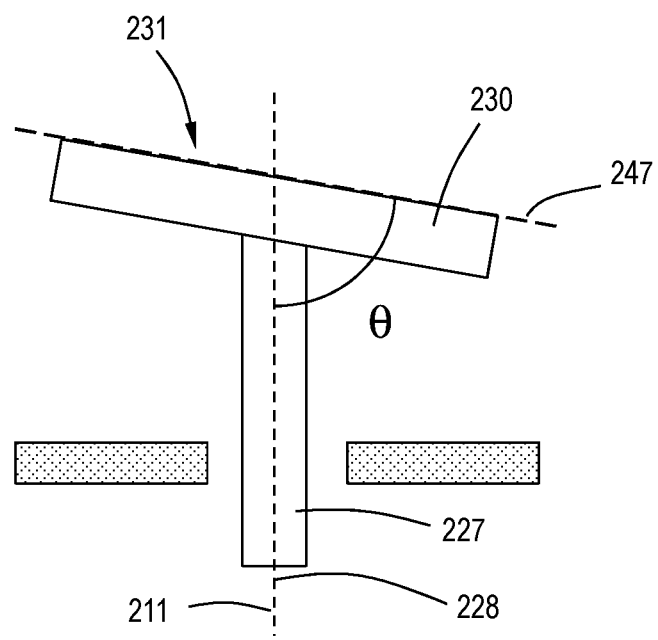
FIG. 9B shows a cross-sectional view of a heater assembly in accordance with one or more embodiment of the disclosure.

In some embodiments, as described in further detail below, runout and wobble due to shaft 227 being in improper alignment as shown in FIGS. 9A and 9B is first corrected by a combination of shimming the connection point between the shaft 227 and the support arms 220. After runout and wobble of the shaft 227 is corrected and brought into proper alignment, the angle θ is brought into proper adjusted to be 90 degrees. In some embodiments the angle θ is brought into proper alignment adjusted to be 90 degrees with ±2 degrees variation. The connection point or flange between the shaft 227 and support assembly 200 is shimmed and secured.

Figure 10:
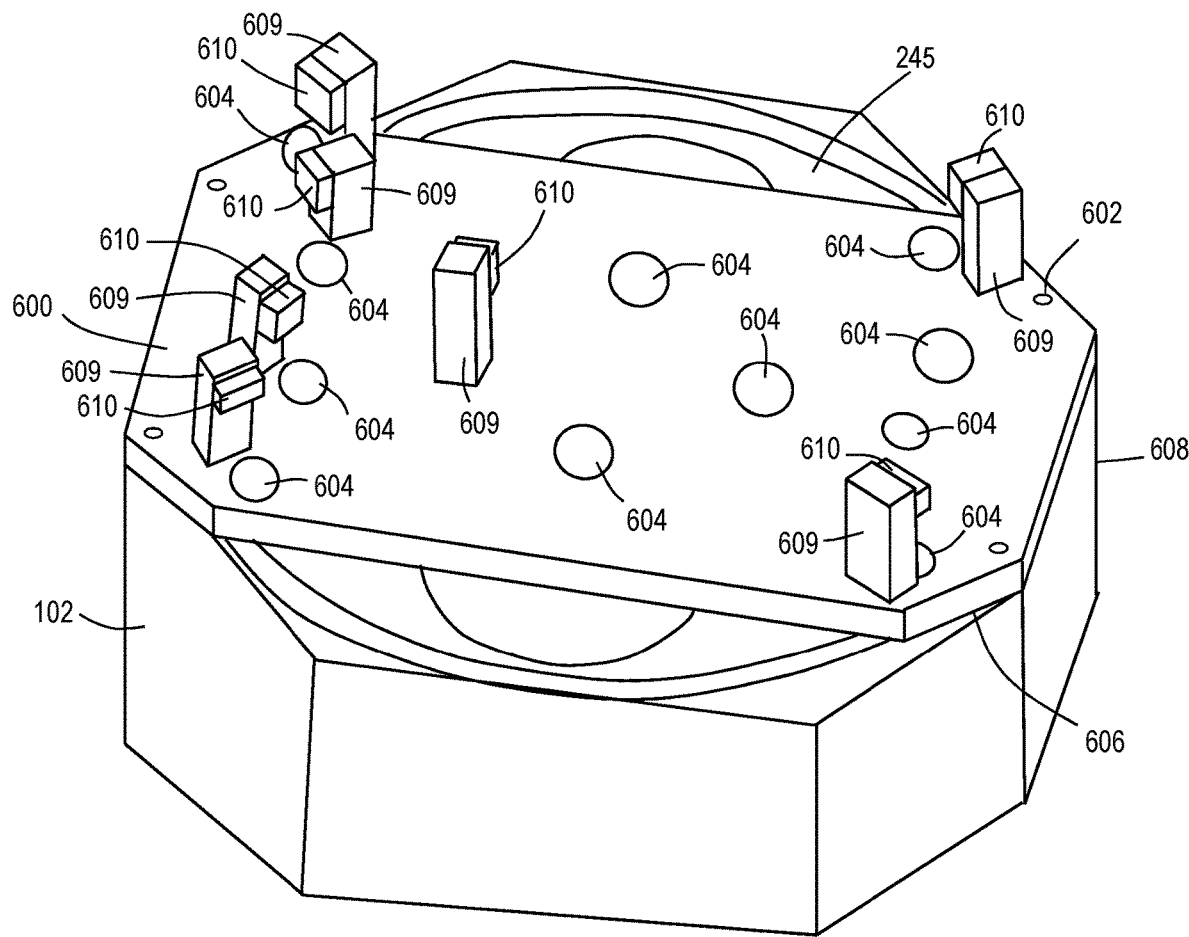
FIG. 10 shows a perspective view of a calibration in contact with a processing chamber in accordance with one or more embodiment of the disclosure.
Figure 11:
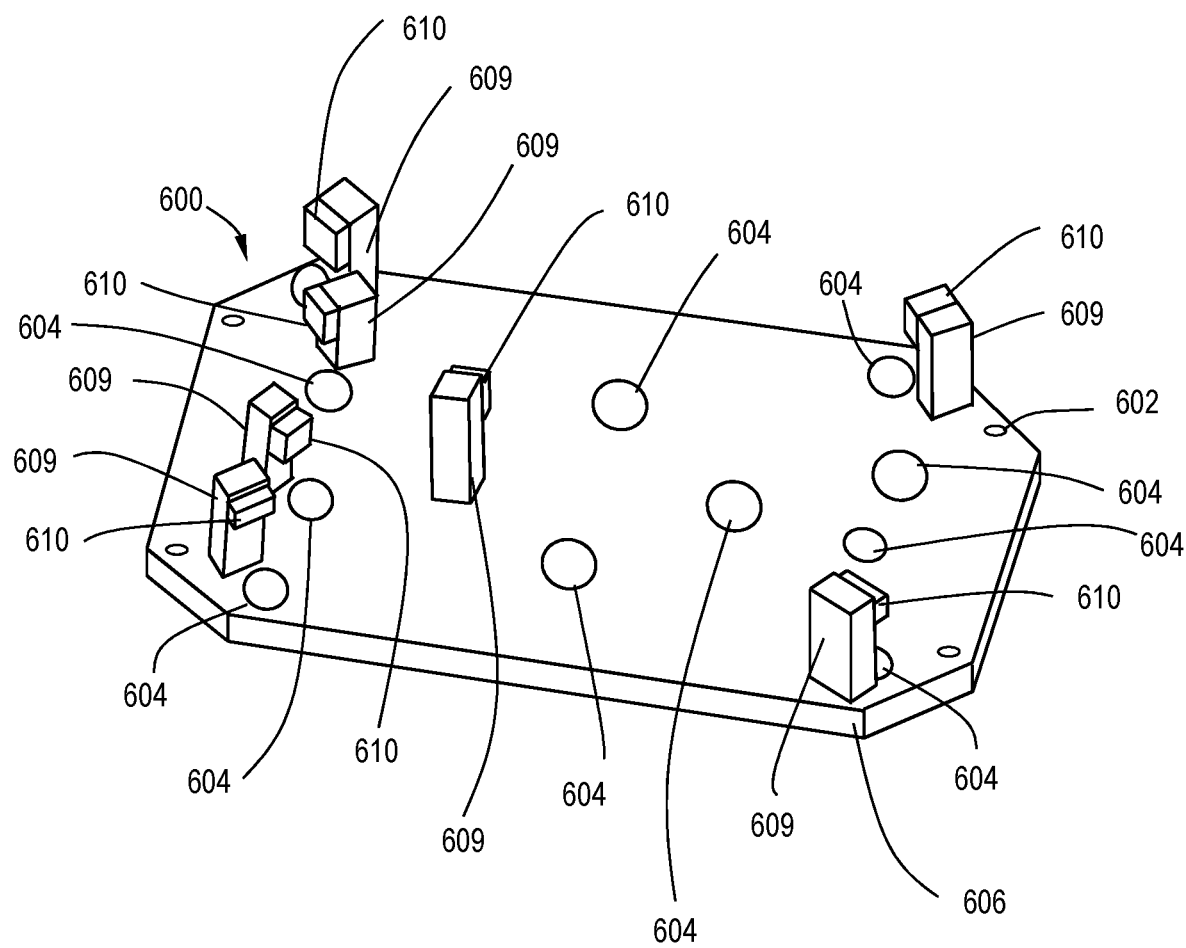
FIG. 11 shows a perspective view of a calibration bar in accordance with one or more embodiment of the disclosure.

As shown in FIGS. 10 and 11, in some embodiments, the top plate 300 is removed and a calibration bar 600 is disposed over the housing 102 of the processing chamber 100 and the support plate 245, with the calibration bar 600 being positioned across a top surface of the housing 102. In some embodiments, the calibration bar 600 is secured by fasteners inserted through holes 602 extending through the calibration bar 600. In some embodiments, the fasteners are threadedly secure to apertures (not shown) extending partially through the top surface of the housing 102, the apertures having corresponding threads for engaging threads of the fasteners. In some embodiments, the apertures of the top surface of the housing 102 are also used for securing the top plate 300 onto the housing 102.

The calibration bar 600 comprises a top surface 604, a bottom surface 606 and a thickness between the top surface 604 and bottom surface, the thickness being configured to prevent bending, warping, and deflection of the calibration bar 600. The material of the calibration bar 600 is selected from a rigid metal, ceramic or polymer to resist bending, warping and deflecting.

The calibration bar 600 further includes a plurality of apertures 602 extending through the thickness 608. Disposed over at least some of the apertures 602 are displacement sensors 610. The sensors of some embodiments are positioned a distance above the top surface 602. In some embodiments, the sensors are positioned on a mounting pedestal 609. The sensors 610 are directed to or facing the top surface 604, and measure distances between the sensor and a position below the top surface 604.

Figure 12:
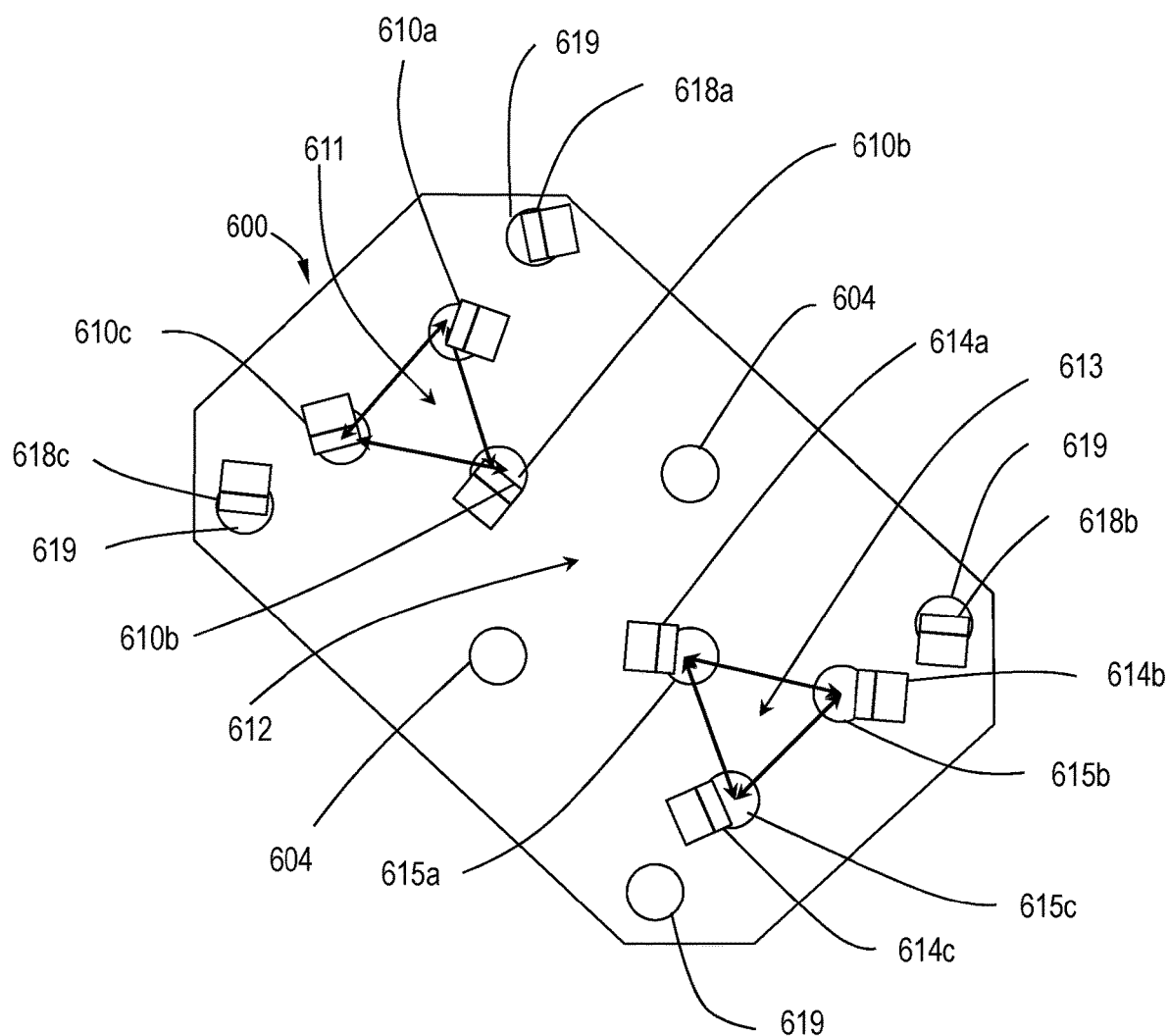
FIG. 12 shows a top view of a calibration bar in accordance with one or more embodiment of the disclosure.
Figure 13:
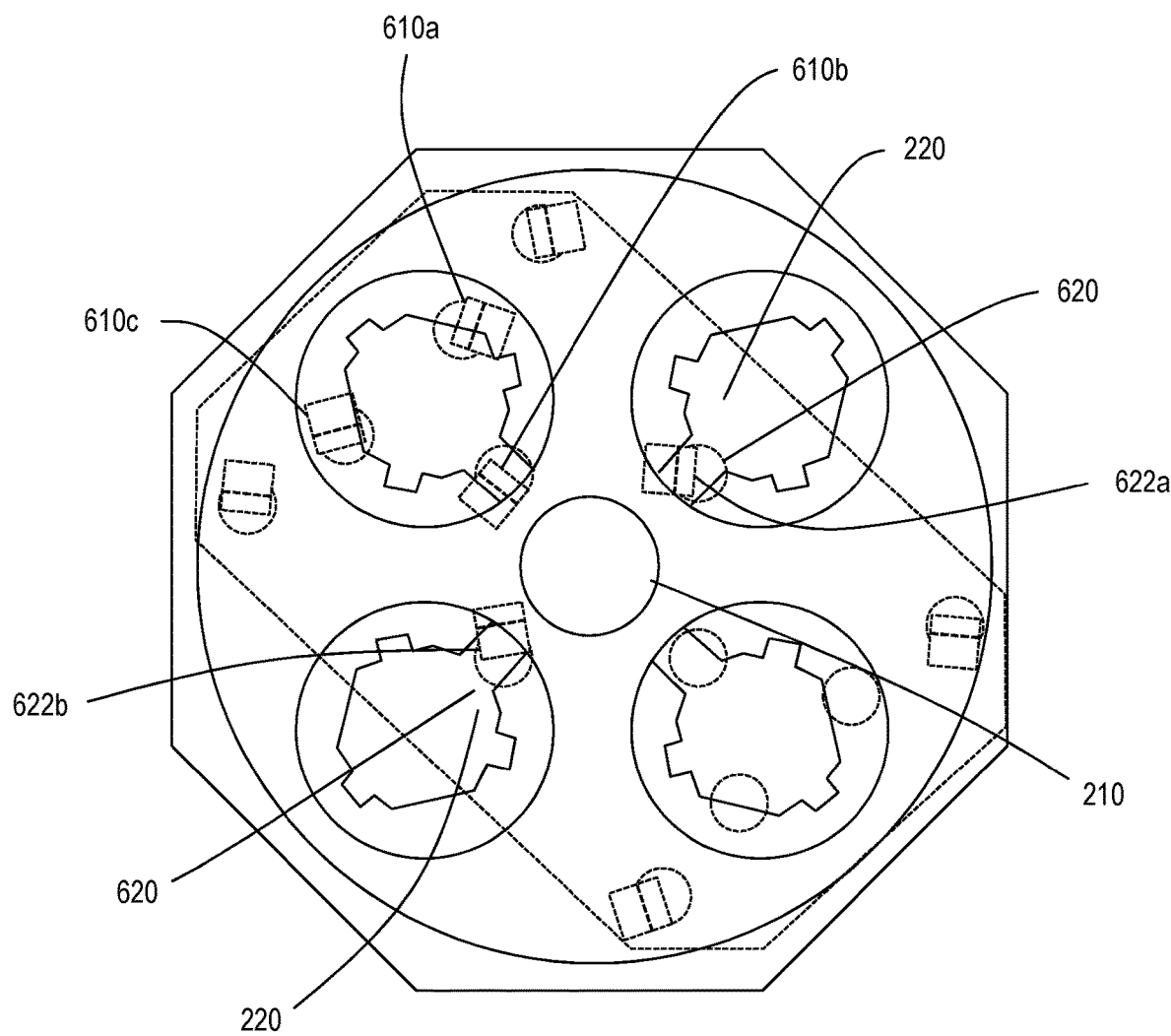
FIG. 13 shows a top view of a calibration bar in contact with a processing chamber in accordance with one or more embodiment of the disclosure.
Figure 14:
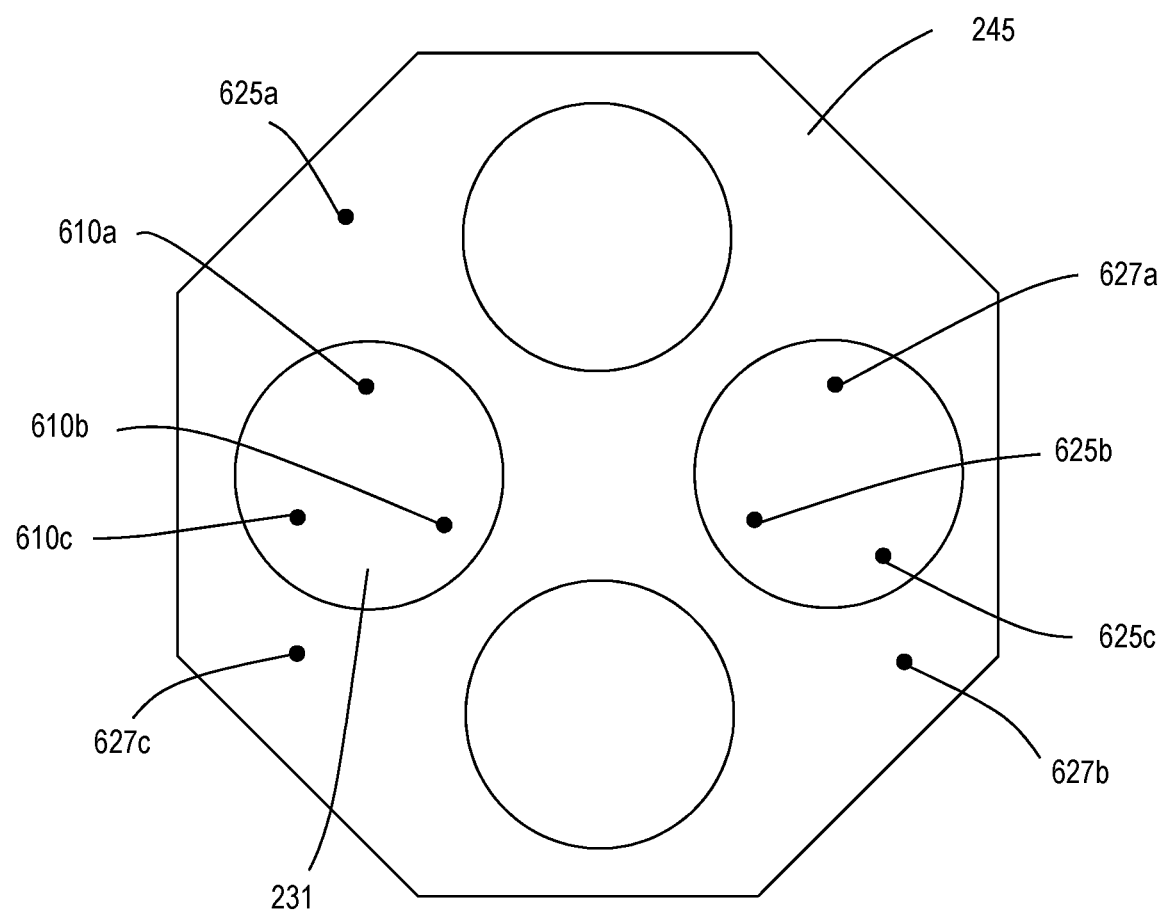
FIG. 14 shows a top view of a support plate in accordance with one or more embodiment of the disclosure.

Referring to FIGS. 12 through 14, in some embodiments, the displacement sensors are laser displacement sensors, so that the laser beam is directed towards the top surface 604, the laser beam forming a right angle to the top surface 604 of the calibration bar 600. In some embodiments, the displacement sensors 610 are KEYENCE® LK-G5000 series sensors. The displacement sensors 610 are configured to measure a distance from the sensor to a point on the support surface 231. In some embodiments, the displacement sensors are also configured to measure a distance between the sensor and a point on the top surface 246 of the support plate 245.

In some embodiments, the displacement sensors 610 are part of at least one set of three sensors. Each of the set of three sensors is configured to measure the distance from the sensor to a point on the surface, so that the three sensors measure the distance to three points on said surface. In some embodiments, the set of three sensors are positioned at equal distances from one another in an equilateral triangular configuration, the triangular configuration being in the x-y plane having a central axis.

In some embodiments, the calibration bar 600 is configured to measure parallelism of a support surface 231 with respect to the corresponding set of three sensors. Parallelism of said surface with respect to the set of three sensors is calculated by the distance between each of the three sensors and a point on the surface, the distance being in the z-plane relative to the x-y plane of the triangular configuration of the sensors. In some embodiments, the calibration bar 600 is configured to measure parallelism of opposite support surfaces 231 with respect to the corresponding two set of three sensors, one set for each of the opposite support surfaces 231. In some embodiments, the calibration bar 600 is configured to measure parallelism of multiple support surfaces 231 with respect to the corresponding multiple sets of three sensors. In some embodiments, the calibration bar 600 is configured to measure parallelism of the top surface 246 of the support plate 245 with respect to a set of three sensors positioned over the top surface 246.

The calibration bar 600 is configured to measure the parallelism of a first of the support surfaces 231. To measure parallelism of the first of the support surfaces 231, a first set of displacement sensors (610a, 610b, 610c) is positioned on the calibration bar 600 and above the first of the support surfaces 231. In some embodiments, as shown in FIG. 12, the rotational axis 228 of the shaft 227, and thus the center of the support surface 231, is aligned and concentric with a center 611 of the previously described triangular configuration of the first set of displacement sensors (610a, 610b, 610c). The center 611 of the triangular configuration of the first set of displacement sensors (610a, 610b, 610c) is positioned a distance from a center 612 of the calibration bar 600. The distance of the center 612 is equal to the distance between the rotational axis 211 of the support assembly 200 to the rotational axis 228 of the shaft 227.

In some embodiments, the calibration bar 600 is configured to measure the parallelism of a second support surface 231. In some embodiments, the calibration bar 600 is configured to measure the parallelism of two opposing support surfaces 231. In such a configuration, a second center 613 of a triangular configuration of a second set of displacement sensors (614a, 614b, 614c) is positioned opposite the center 611 of the triangular configuration of the first set of displacement sensors (610a, 610b, 610c) relative to the center 612 of the calibration bar 600. The distance of the second center 613 is equal to the distance between the rotational axis 211 of the support assembly 200 to the rotational axis 228 of the shaft 227. The second set of displacement sensors (614a, 614b, 614c) is configured to measure three points on the second support surface 231, the second set of displacement sensors (614a, 614b, 614c) being positioned over a second set of apertures (615a, 615b, 615c) of the calibration bar 600.

In some embodiments, the calibration bar 600 further includes a third set of displacement sensors (618a, 518b, 618c) disposed over apertures 619 for measuring the distance from the top surface 604 of the calibration bar 600 to the third set of displacement sensors (618a, 518b, 618c).

Figure 15:
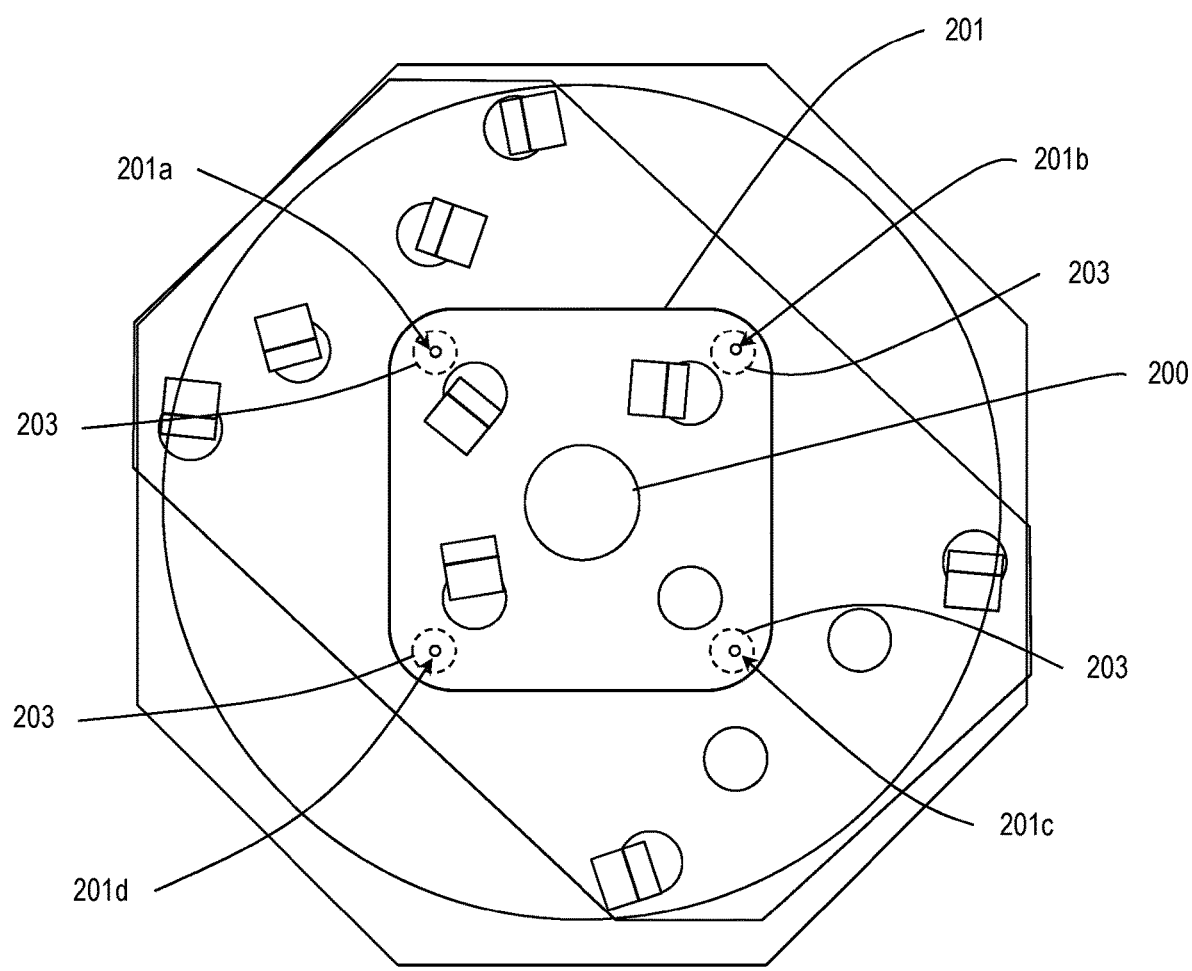
FIG. 15 shows a top view of a calibration bar in contact with a processing chamber in accordance with one or more embodiment of the disclosure.
Figure 16:
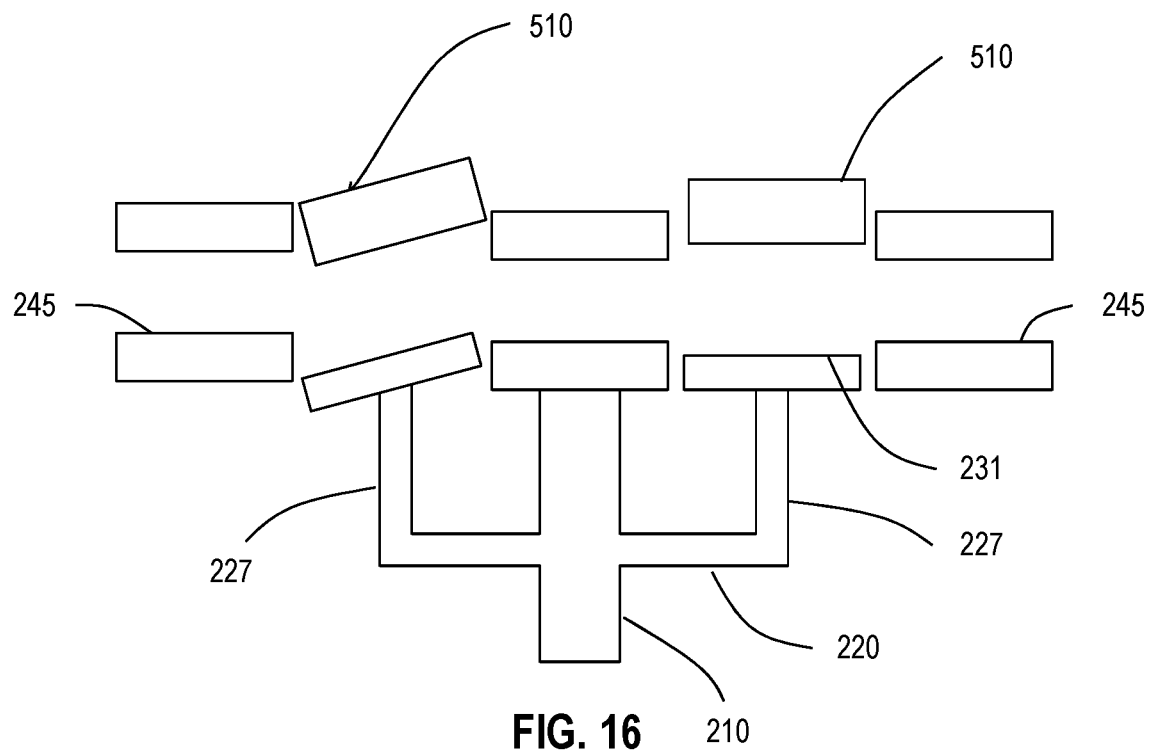
FIG. 16 shows a cross-sectional side view of a support assembly in accordance with one or more embodiment of the disclosure.
Figure 17:
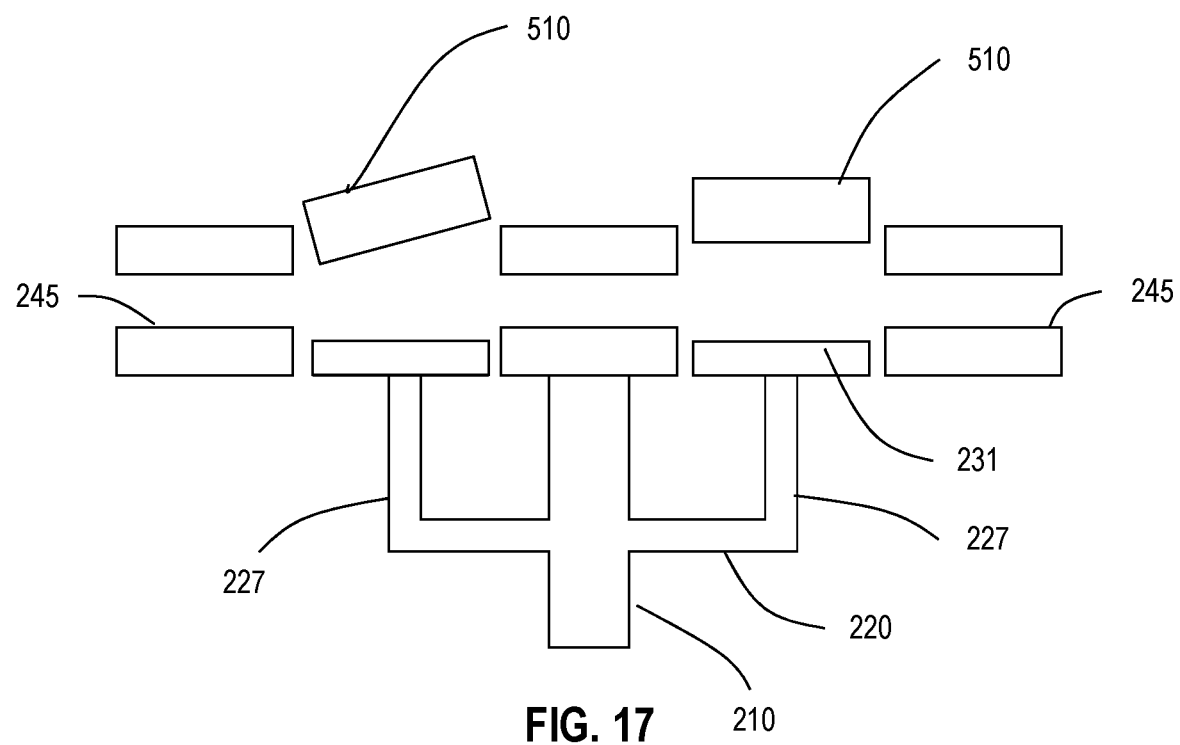
FIG. 17 shows a cross-sectional side view of a support assembly in accordance with one or more embodiment of the disclosure.
Figure 18:
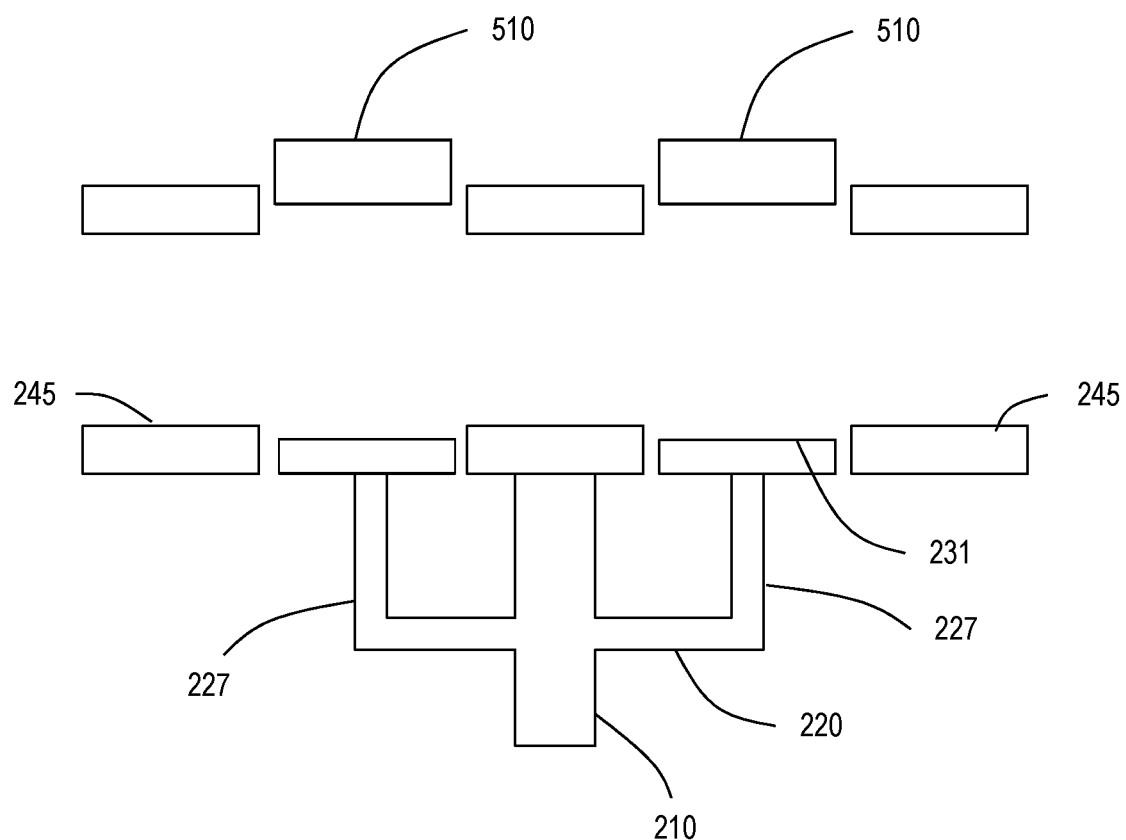
FIG. 18 shows a cross-sectional side view of a support assembly in accordance with one or more embodiment of the disclosure.

As shown in FIGS. 2 and 15, adjustment bolts 203 which support the mounting plate 201 of the support assembly 200 can be adjusted or shimmed to correct parallelism of the rotatable center base 210. The adjustment bolts 203 are configured to adjust the height of four corner holes (201a, 201b, 201c, 201d) of the mounting plate 201 in order to adjust the parallelism of the entire support assembly 200 from the rotatable center base 220. In some embodiments, as shown in FIG. 2, between the adjustment bolts 203 and the mounting plate 201 shims 207 are positioned to lock in the proper height adjustment of each of the adjustment bolts 203. The shims 207 are positioned between the mounting plate 201 and the bottom 106 of the chamber 100.

In some embodiments, as shown in FIG. 13, the heaters 230 are temporarily removed, exposing the at least two support arms 220. From apertures 620, a fourth set of displacement sensors (622a, 622b) are configured to measure the distance from the sensor to the support arms 220. To form a triangular configuration, one of the displacement sensors from the first or second set of displacement sensors are utilized. In one embodiment, as shown in FIG. 13, the displacement sensor 610b of the first set of displacement sensors (610a, 610b, 610c) is utilized along with the fourth set of displacement sensors (622a, 622b) to form a triangular configuration where parallelism of the rotatable center base 210 is calculated.

FIG. 14 illustrates the potential sets of points on the support surfaces 231 of the heaters 230 and the support plate 245. As previously described, in some embodiments, the first set of displacement sensors (610a, 610b, 610c) measure a first set of points (623a, 623b, 623c) on the support surface 231, the second set of displacement sensors (614a, 614b, 614c) measure a second set of points (625a, 625b, 625c) on the support surface 231, and the third set of displacement sensors (618a, 518b, 618c) measure a third set of points (627a, 627b, 627c) on the support plate 245.

With reference to FIGS. 16-19, a method is described for correcting parallelism in the support surfaces 231 with respect to the shafts 227 is described. In some embodiments, the method further describes correcting the angle ∂ of the shafts 227 and for correcting runout of the shafts 227 with respect to the support assembly 200, thereby bringing the support surfaces 231 and shafts 227 into proper alignment. In some embodiments, the method further describes correcting parallelism of the processing stations 510.

The method comprises leveling the motor shaft 227 to remove runout of the motor shaft 227 relative to the rotational axis 228 to provide a leveled motor shaft 227 and leveling the major support plane 247 relative to the leveled motor shaft 227, whereby the angle θ is at 90 degrees. In some embodiments, slight variation to the angle θ in the range of ±2 is permissible.

To level the motor shaft 227, measurements of three points (231a, 231b 231c) on the support surface 231 are taken by at least three displacement sensors (610a, 610b, 610c) positioned over the substrate support 231 as previously described. The least three displacement sensors (610a, 610b, 610c) are positioned at about the same radial distance from the rotational axis 228 and at different angular positions relative to the rotational axis 211. In some embodiments, the least three displacement sensors (610a, 610b, 610c) are in an equilateral triangular configuration as previously described.

The substrate support 200 is then rotated around the rotational axis 228 and an angle dependent motor leveling profile for each of the at least three displacement sensors (610a, 610b, 610c) is recorded. Shim values are subsequently determined for motor bolts 517 based on the angle dependent motor leveling profiles of the at least three displacement sensors (610a, 610b, 610c). The motor bolts may then be shimmed in accordance with shim values to provide the leveled motor shaft 227.

The major support plane 247 comprises a plurality of heater support surfaces 231 and leveling the major support plane 247 comprises determining a heater major support plane 247 for each of the plurality of heater support surfaces 231. To determine the heater major support plane 247 for each of the plurality of heater support surfaces 231, each heater support surface 231 is measured using at least three displacement sensors (610a, 610b, 610c). Each heater support surface 231 is rotated a station comprising the at least three displacement sensors (610a, 610b, 610c). so that each of the heater support surfaces 231 are measured in the same station. Each of the heater support planes 231 are then shimmed.

Figure 19:
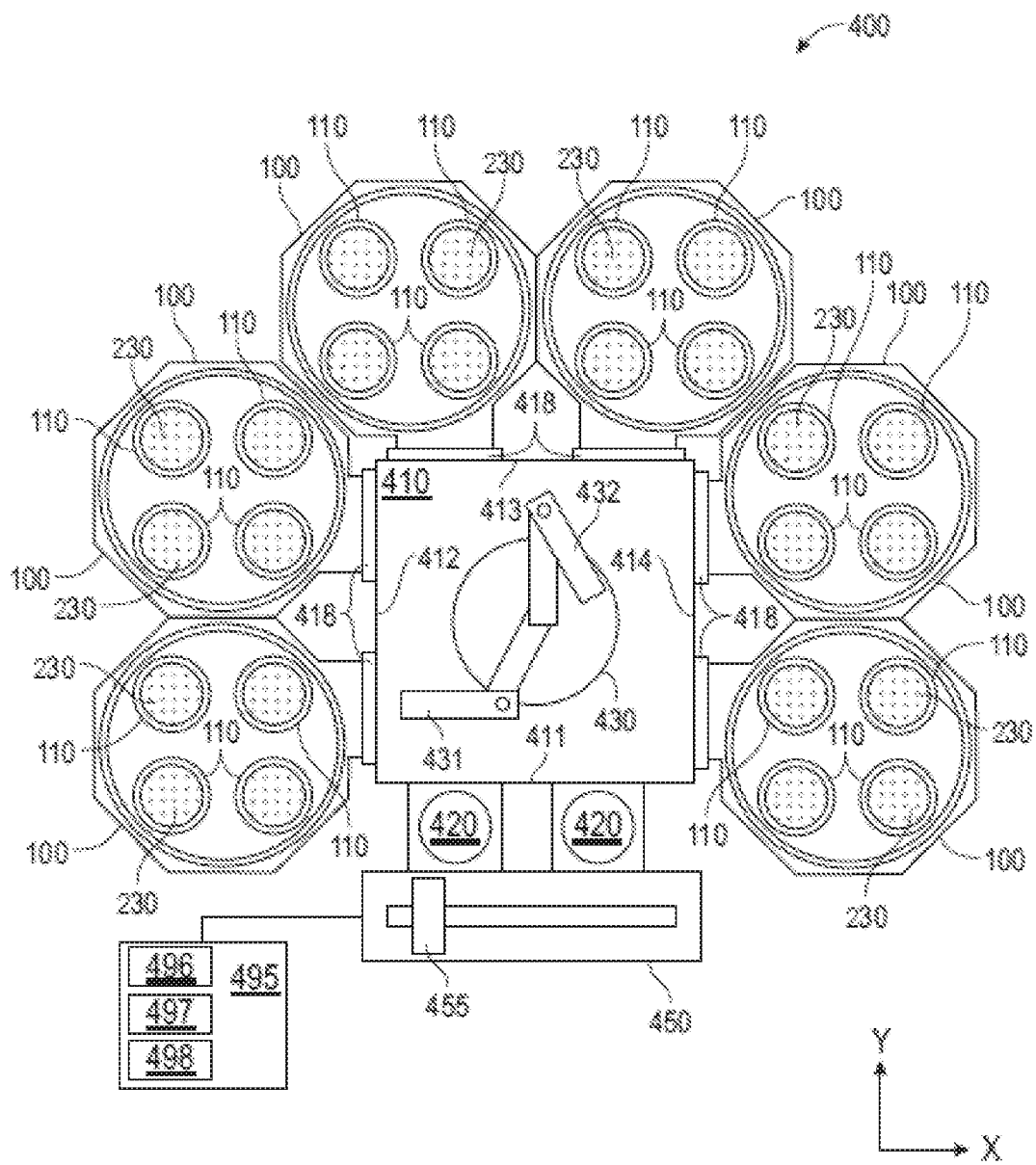
FIG. 19 shows a schematic representation of a processing platform in accordance with one or more embodiment of the disclosure.

FIG. 19 shows a processing platform 400 in accordance with one or more embodiment of the disclosure. The embodiment shown in FIG. 19 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the -axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

A power supply 530 is connected to the electrodes 521, 522 to generate the voltage differential between the electrodes 521, 522. The power supply 530 connects through transmission lines 531, 532 to the electrodes 521, 522. The transmission lines 531, 532 are electrically separated by any suitable insulator to prevent shorting or arcing.

The power supply 530 of some embodiments provides a first voltage (also referred to as potential) to the electrode 521 and a second voltage to the electrode 522 that is different from the first voltage. In some embodiments, the power supply 530 is configured to provide high voltage direct current (DC) and a low voltage alternating current (AC) component to the electrodes 521, 522.

In one or more embodiments of the disclosure, the power supply 530 includes or is connected to a capacitance sensor 535. In some embodiments, the capacitance sensor 535 is a separate sensor within the body 502 of the substrate support 500, as shown in FIG. 2. In some embodiments, the capacitance sensor is a part of the electronics of the power supply 530.

In some embodiments, the controller 590 is connected to the at least one heating element 540 and is configured to control power to the at least one heating element 540. In some embodiments, the controller 590 is connected to a temperature sensor (e.g., pyrometer, thermocouple, etc.) to measure the temperature of a substrate or of the substrate support 500 and to change the power to the heating element 540 to maintain a predetermined temperature.

In some embodiments, the controller 590 is connected to the displacement sensors and is configured to determine the deviation of at least the vertical processing gap. The controller 590 is further configured to determine coplanarity of the support surfaces 231 and provide shimming values for mechanical calibration. The controller 590 is further configured to measure one or more of a process gap between a substrate and a shower head, a lift pin actuation plane, top surface planarity, heater standoff 234 runout, heater standoff 234 deflection due to vacuum and parallelism of a heater to a showerhead.

The controller or non-transitory computer readable medium of some embodiments has one or more configurations or instructions selected from a configuration to: level the motor shaft connected to the substrate support and rotate a plurality of substrates around a rotational axis to remove runout of the motor shaft relative to the rotational axis to provide a leveled motor shaft and leveling a support plane formed by the substrate support on the leveled motor shaft.

Further embodiments of the disclosure are directed to non-transitory computer readable medium including instructions, that, when executed by a controller of a processing chamber, cause the processing chamber to perform operations of one or more of: taking measurements of the substrate support from at least three sensors; rotating the substrate support around the rotational axis and recording an angle dependent motor leveling profile for each of the at least three sensors; determining shim values for motor bolts based on the angle dependent motor leveling profiles of the at least three sensors.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

The invention claimed is:

1. A process chamber comprising:
a chamber body having a bottom and sidewalls defining an interior volume;
a motor shaft extending through the bottom of the chamber body defining a rotational axis, the motor shaft connected to a motor assembly connected to the bottom of the chamber body outside the interior volume, the motor assembly comprising a plurality of motor bolts;
a substrate support having a support plane connected to the motor shaft within the interior volume;
a first plurality of sensors arranged at about the same radial distance from the rotational axis and at different angular positions relative to the rotational axis; and
a second plurality of sensors arranged to measure an angle of the support plane with respect to the rotational axis of the motor shaft.

2. The process chamber of claim 1, wherein the substrate support comprises a plurality of heater supports in a top plate, each of heater support having a heater support plane exposed through an opening in the top plate.

3. The process chamber of claim 2, wherein the first plurality of sensors are arranged to measure a distance between the first plurality of sensors and the top plate.

4. The process chamber of claim 3, wherein the second plurality of sensors are arranged to measure an angle of one heater support plane with respect to the rotational axis of the motor shaft.

5. The process chamber of claim 4, further comprising a controller connected to the motor shaft, first plurality of sensors and second plurality of sensors and having one or more configurations selected from: a configuration to rotate the substrate support to an angular position; a configuration to obtain measurements from each of the first plurality of sensors; and a configuration to obtain measurements from each of the second plurality of sensors.

6. The process chamber of claim 5, wherein the controller is configured to determine an angle dependent motor leveling profile for each of the first plurality of sensors.

7. The process chamber of claim 6, wherein the controller is configured to determine shim values for motor bolts based on the angle dependent motor leveling profiles of the at least three sensors.

8. The process chamber of claim 5, wherein the second plurality of sensors are arranged within a process station within the process chamber and the controller is configured to rotate the substrate support to position a heater support within the process station and determine an equation of the heater support plane and repeat to determine an equation of each of the heater support planes.

9. The process chamber of claim 8, wherein the controller is configured to determine a shim value to level the support plane based on the equations of the heater support planes.

* * * * *